US012201002B2

(12) United States Patent
Zhang et al.

(10) Patent No.: US 12,201,002 B2
(45) Date of Patent: Jan. 14, 2025

(54) ORGANIC LIGHT-EMITTING TOUCH DISPLAY PANEL AND DISPLAY APPARATUS

(71) Applicant: HUAWEI TECHNOLOGIES CO., LTD., Guangdong (CN)

(72) Inventors: Junyong Zhang, Dongguan (CN); Tawei Kuo, Shenzhen (CN); Zheng Tian, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/907,260

(22) PCT Filed: Mar. 16, 2021

(86) PCT No.: PCT/CN2021/080901
§ 371 (c)(1),
(2) Date: Sep. 24, 2022

(87) PCT Pub. No.: WO2021/190345
PCT Pub. Date: Sep. 30, 2021

(65) Prior Publication Data
US 2023/0354669 A1  Nov. 2, 2023

(30) Foreign Application Priority Data

Mar. 27, 2020  (CN) .......................... 202010230878.X

(51) Int. Cl.
*H10K 59/40* (2023.01)
*G06F 3/041* (2006.01)
*G06F 3/044* (2006.01)

(52) U.S. Cl.
CPC ......... *H10K 59/40* (2023.02); *G06F 3/04164* (2019.05); *G06F 3/0443* (2019.05);
(Continued)

(58) Field of Classification Search
CPC .... G06F 3/0445; G06F 3/0446; G06F 3/0447; G06F 3/0443; G06F 3/04164;
(Continued)

(56) References Cited

U.S. PATENT DOCUMENTS

2016/0253023 A1  9/2016  Aoyama et al.
2017/0097703 A1* 4/2017  Lee ........................ G06F 3/0443
(Continued)

FOREIGN PATENT DOCUMENTS

CN    104698700 A    6/2015
CN    104965622 A   10/2015
(Continued)

*Primary Examiner* — Nitin Patel
*Assistant Examiner* — Amen W Bogale

(57) ABSTRACT

This application provides an organic light-emitting touch display panel and an organic light-emitting touch display apparatus, including a display layer (10), a touch layer (20), and a packaging layer (30) disposed between the display layer (10) and the touch layer (20), where the three layers are disposed along a thickness direction of the organic light-emitting touch display panel, and the touch layer (20) is disposed on the packaging layer (30). The display layer (10) includes a plurality of display units (11), and the display unit (11) includes a first electrode (111), a second electrode (112), and an organic light-emitting layer (113) disposed between the first electrode (111) and the second electrode (112). The touch layer (20) includes a touch-sensitive layer, a first insulation layer (23), and a touch wiring layer that are disposed in the thickness direction of the organic light-emitting touch display panel, and the first insulation layer (23) is disposed between the touch-sensitive sensitive layer and the touch wiring layer. The touch-sensitive layer includes a plurality of touch- electrodes (21) that are insulated from each other, the touch wiring layer includes a plurality of touch sensor traces (22), and the touch-sensitive electrodes (21) are electrically connected to at least one
(Continued)

touch sensor trace (22). The organic light-emitting touch display panel reduces impact of the touch layer on a voltage signal of the display layer, reduces touch blind spots, and improves touch accuracy.

16 Claims, 9 Drawing Sheets

(52) U.S. Cl.
CPC .......... *G06F 3/0446* (2019.05); *G06F 3/0448* (2019.05); *G06F 2203/04102* (2013.01)

(58) Field of Classification Search
CPC .. G06F 3/0412; G06F 3/0448; G06F 3/04166; G06F 2203/04112; G06F 2203/04103; G06F 2203/04102; H10K 59/40
See application file for complete search history.

(56) References Cited

U.S. PATENT DOCUMENTS

| | | | |
|---|---|---|---|
| 2017/0115818 A1 | 4/2017 | Cai et al. | |
| 2017/0293384 A1* | 10/2017 | Ryu | ................... H01L 27/1248 |
| 2017/0308199 A1* | 10/2017 | Liu | ....................... G06F 3/0443 |
| 2019/0204944 A1 | 7/2019 | Jun et al. | |
| 2019/0294274 A1* | 9/2019 | Cho | ....................... G06F 3/0416 |
| 2019/0332219 A1* | 10/2019 | Kong | ....................... G06F 3/047 |
| 2019/0391691 A1* | 12/2019 | Zhou | ................... G06F 3/04164 |
| 2021/0200353 A1 | 7/2021 | Liu et al. | |
| 2022/0291779 A1* | 9/2022 | Kim | ................... G06F 3/04164 |

FOREIGN PATENT DOCUMENTS

| | | |
|---|---|---|
| CN | 105468202 A | 4/2016 |
| CN | 107122077 A | 9/2017 |
| CN | 107180852 A | 9/2017 |
| CN | 107861658 A | 3/2018 |
| CN | 108319397 A | 7/2018 |
| CN | 108762571 A | 11/2018 |
| CN | 109634459 A | 4/2019 |
| CN | 109634470 A | 4/2019 |
| CN | 109859648 A | 6/2019 |
| CN | 109933234 A | 6/2019 |

* cited by examiner

ORGANIC LIGHT-EMITTING TOUCH DISPLAY PANEL AND DISPLAY APPARATUS

CROSS-REFERENCE TO RELATED APPLICATIONS

This application is a national stage of International Application No. PCT/CN2021/080901, filed on Mar. 16, 2021, which claims priority to Chinese Patent Application No. 202010230878.X, filed on Mar. 27, 2020 and entitled "ORGANIC LIGHT-EMITTING TOUCH DISPLAY PANEL AND DISPLAY APPARATUS". All of the aforementioned applications are hereby incorporated by reference in their entireties.

TECHNICAL FIELD

This application relates to the field of display technologies, and in particular, to an organic light-emitting touch display panel and display apparatus.

BACKGROUND

Organic light-emitting display is increasingly widely used because of performance such as a fast response, light weight, a wide angle of view, and low power consumption. The organic light-emitting display may be implemented in flexible display technology, and provide a plurality of application forms such as a waterfall screen, a wrap-around screen, and a folding screen for a mobile display device. Therefore, flexible organic light-emitting display gradually becomes a mainstream direction of the mobile display device.

Currently, a touch solution of organic light-emitting display is mainly a mutual-capacitance touch technology; to be specific, a touch module is disposed on a display module of an organic light-emitting touch display panel. The touch module includes a first touch electrode and a second touch electrode that are located on different layers and are insulated from each other, and the first touch electrode and the second touch electrode are disposed in a thickness direction of the organic light-emitting touch display panel. One of the first touch electrode and the second touch electrode receives a touch drive signal, and the other outputs a touch-sensitive signal. In other words, there is a touch-related signal on both the first touch electrode and the second touch electrode. In addition, because both an area of the first touch electrode and an area of the second touch electrode are relatively large, projections of both the first touch electrode and the second touch electrode in the thickness direction of the organic light-emitting touch display panel cover a pixel in the display module. In this case, both the first touch electrode and the second touch electrode affect a display signal of the pixel in the display module, and consequently, normal display is affected.

SUMMARY

This application provides an organic light-emitting touch display panel and display apparatus, to resolve the foregoing problem.

According to a first aspect, an embodiment of this application provides an organic light-emitting touch display panel, including a display layer, a touch layer, and a packaging layer disposed between the display layer and the touch layer, where the three layers are disposed in a thickness direction of the organic light-emitting touch display panel, and the touch layer is disposed on the packaging layer. The display layer includes a plurality of display units in which a display unit includes a first electrode, a second electrode, and an organic light-emitting layer disposed between the first electrode and the second electrode. The touch layer includes a touch-sensitive layer, a first insulation layer, and a touch wiring layer that are disposed in the thickness direction of the organic light-emitting touch display panel, and the first insulation layer is disposed between the touch-sensitive layer and the touch wiring layer. The touch-sensitive layer includes a plurality of touch-sensitive electrodes that are insulated from each other, the touch wiring layer includes a plurality of touch sensor traces, and the touch-sensitive electrodes are electrically connected to at least one touch sensor trace.

In an implementation of the first aspect, the touch wiring layer is disposed on a side that is of the first insulation layer and that is close to the packaging layer.

In an implementation of the first aspect, the touch-sensitive electrode is in a metal grid structure.

In an implementation of the first aspect, the touch-sensitive electrode includes a metal part and a hollow part located between metal parts, and a projection of the metal part on the display layer is located between the display units.

In an implementation of the first aspect, a contour of the touch-sensitive electrode is a rectangle.

In an implementation of the first aspect, some edges of the touch-sensitive electrode include a convex part and a concave part. In two adjacent touch-sensitive electrodes, a convex part of one touch-sensitive electrode is disposed in a concave part of the other touch-sensitive electrode.

In an implementation of the first aspect, a shape of the convex part is at least one of a rectangle, a triangle, and a trapezoid.

In an implementation of the first aspect, the organic light-emitting touch display panel includes a bonding region, and the bonding region includes a plurality of bonding pads. The bonding pads are bonded to an integrated circuit chip; or the bonding pads are bonded to a flexible circuit board, and an integrated circuit chip is bonded on the flexible circuit board. The integrated circuit chip provides a touch drive voltage for the touch-sensitive electrode. The plurality of touch-sensitive electrodes include a first touch-sensitive electrode and a second touch-sensitive electrode, and a distance between the first touch-sensitive electrode and the bonding region is greater than a distance between the second touch-sensitive electrode and the bonding region.

In an implementation of the first aspect, a quantity of touch sensor traces electrically connected to the first touch-sensitive electrode is greater than a quantity of touch sensor traces electrically connected to the second touch-sensitive electrode.

In an implementation of the first aspect, in one touch period, a time at which the second touch-sensitive electrode receives the touch drive voltage is earlier than a time at which the first touch-sensitive electrode receives the touch drive voltage.

According to a second aspect, an embodiment of this application further provides an organic light-emitting touch display apparatus, and the organic light-emitting touch display apparatus includes the organic light-emitting touch display panel provided in the first aspect.

In the organic light-emitting touch display panel and the organic light-emitting touch display apparatus provided in embodiments of this application, because the touch-sensitive electrodes are disposed at a same layer, and a width of the touch sensor trace is relatively narrow, the touch sensor trace in the touch layer has relatively small impact on a signal on an electrode in the display layer, and therefore, in embodiments of this application, impact exerted by the touch layer on a display effect is reduced. In addition, the touch-sensitive electrode and the touch sensor trace are located in different film layers, to prevent the touch sensor trace from occupying an area used by the touch-sensitive layer for touch sensing, so that a distance between adjacent touch electrodes in the touch-sensitive layer is reduced, and touch blind spots are reduced.

DESCRIPTION OF EMBODIMENTS

Terms used in embodiments of this application are only used to explain specific embodiments of this application, but are not intended to limit this application.

Figure 1:
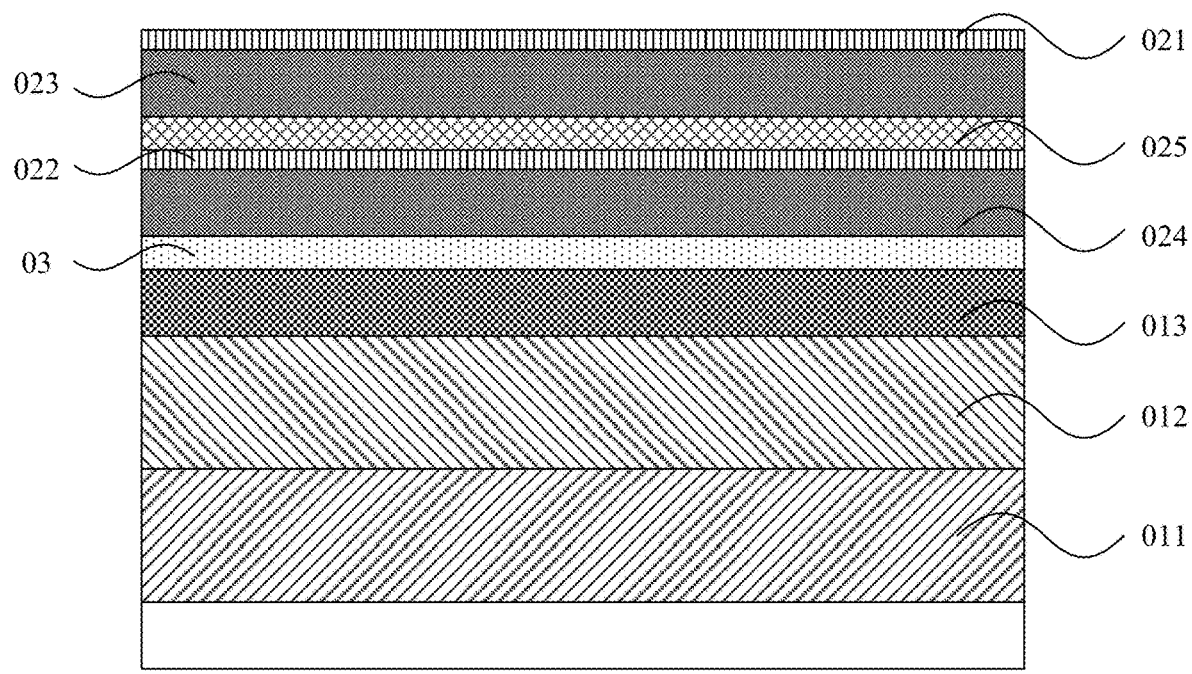
FIG. 1 is a schematic diagram of an organic light-emitting touch display panel in the conventional technology.
Figure 2:
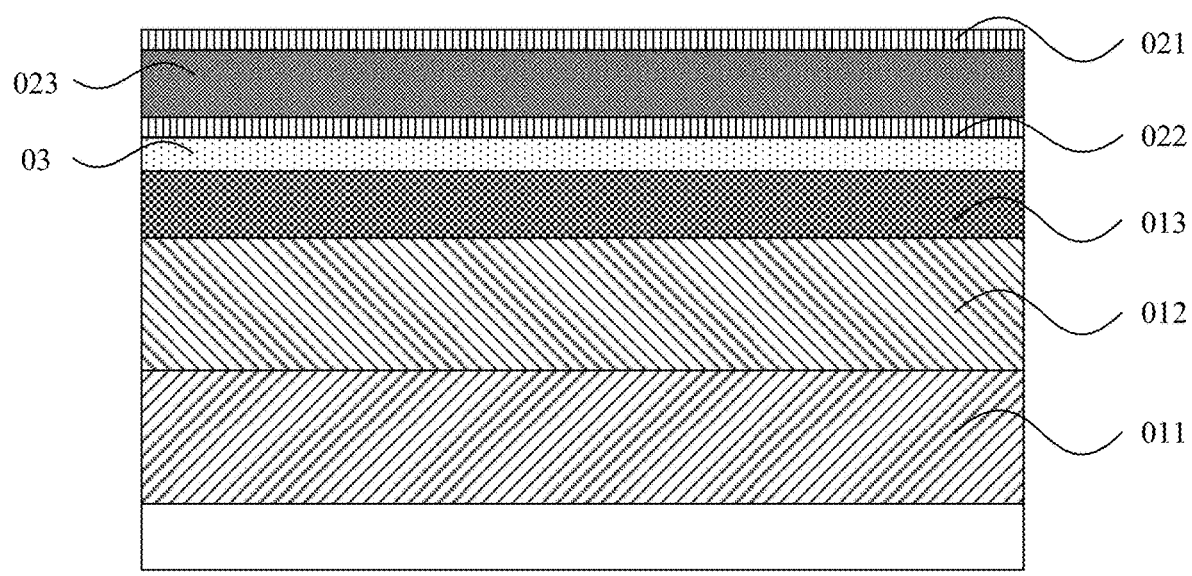
FIG. 2 is a schematic diagram of another organic light-emitting touch display panel in the conventional technology.
Figure 3:
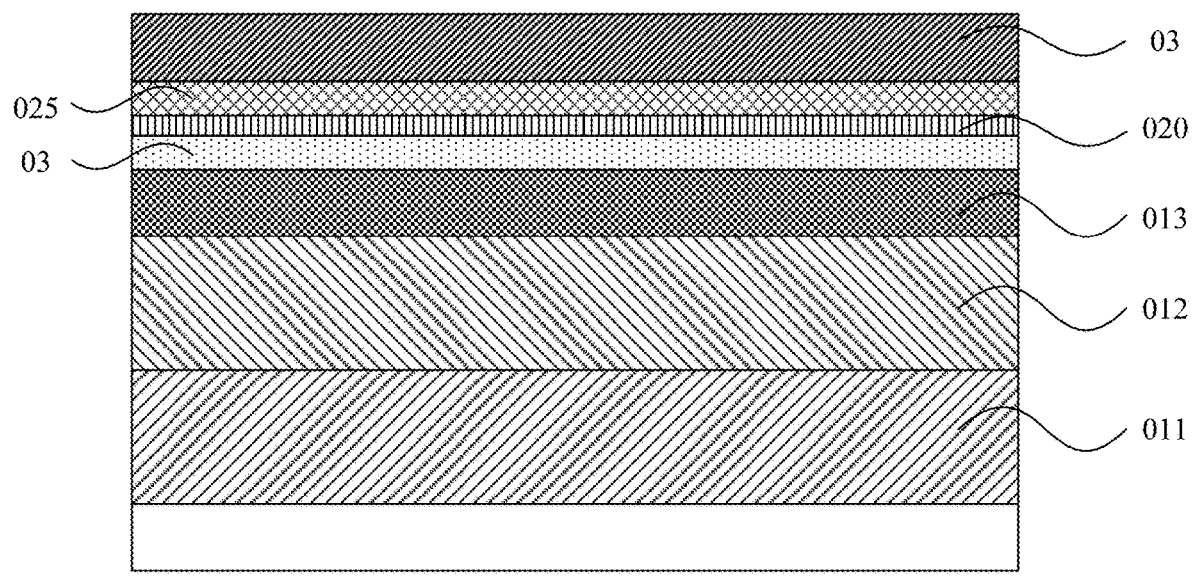
FIG. 3 is a schematic diagram of still another organic light-emitting touch display panel in the conventional technology.

FIG. 1 is a schematic diagram of an organic light-emitting touch display panel in the conventional technology. FIG. 2 is a schematic diagram of another organic light-emitting touch display panel in the conventional technology. FIG. 3 is a schematic diagram of still another organic light-emitting touch display panel in the conventional technology. As shown in FIG. 1 to FIG. 3, a main touch form of organic light-emitting display in the conventional technology is an external mounting type. As shown in FIG. 1, in a solution in the conventional technology, the organic light-emitting touch display panel includes a display module and a touch module that are bonded together by using a first optical adhesive layer 023. The display module includes a switch array layer 011, a display layer 012, and a packaging layer 013. The touch module includes a first touch electrode layer 021 disposed on a substrate 023, a second touch electrode layer 022 disposed on a substrate 024, and a second optical adhesive layer 025 used to bond the two parts together. A solution in FIG. 2 in which the touch module is externally mounted differs from the solution shown in FIG. 1 only in the touch module. Specifically, the first touch electrode layer 021 and the second touch electrode layer 022 are separately disposed on one side of the substrate 023. As shown in FIG. 3, in the solution in the conventional technology, the touch module includes only a touch electrode layer 020, and the touch electrode layer 020 needs to be stripped after being prepared, and then bonded to a polarizer 03 by using the second optical adhesive layer 025. A process is complex and costs are relatively high. In addition, in the organic light-emitting touch display panels shown in FIG. 1 to FIG. 3, the first touch electrode layer 021 and the second touch electrode layer 022 or the touch electrode layer 020 are generally prepared by using transparent metal oxide (such as ITO, Indium tin oxide) to enable transmittance to be relatively low, and generally, the transparent metal oxide needs to be prepared on another substrate, so that a thickness of the organic light-emitting touch display panel is relatively thick.

Figure 4:
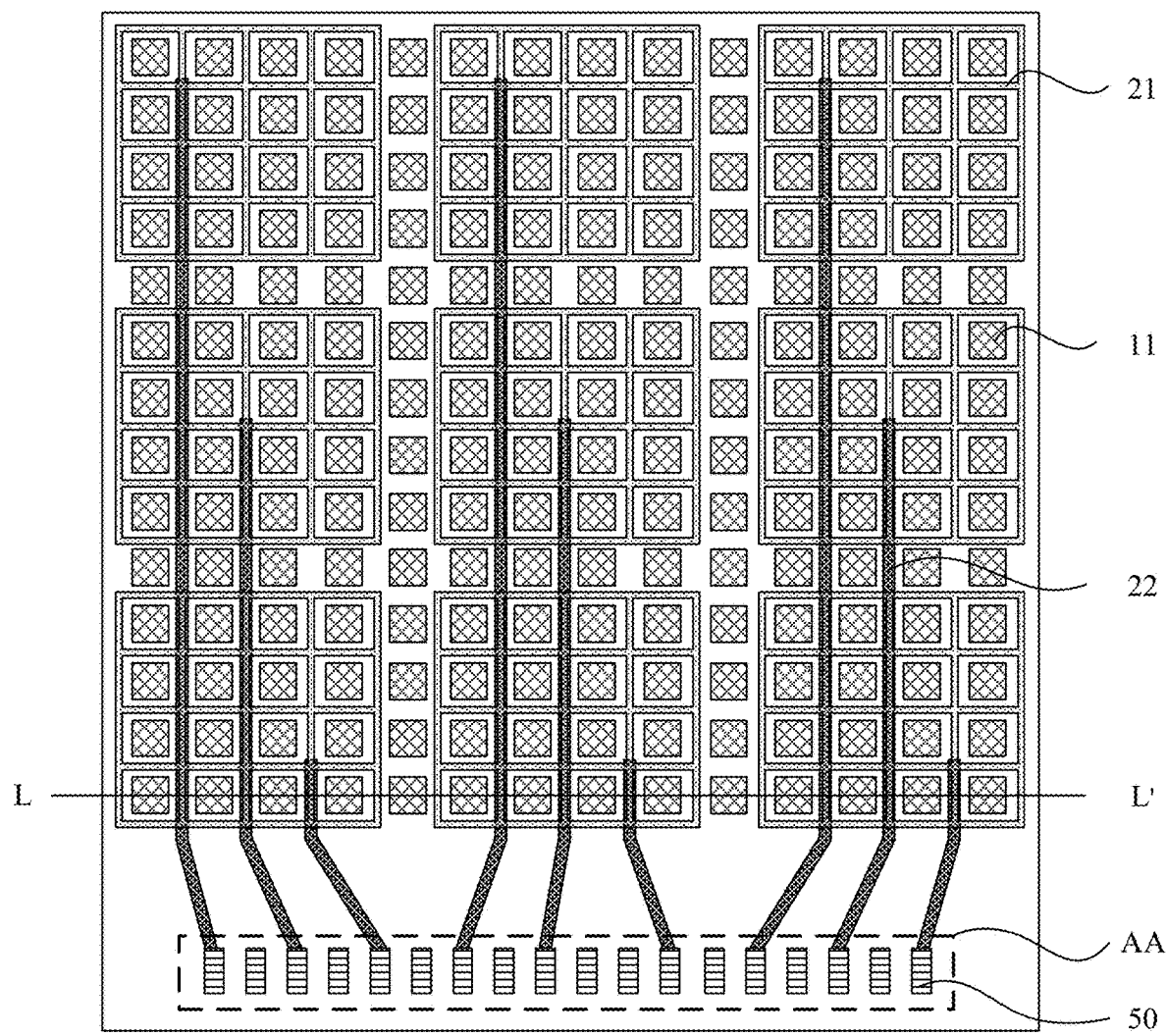
FIG. 4 is a schematic diagram of an organic light-emitting touch display panel according to an embodiment of this application.
Figure 5:
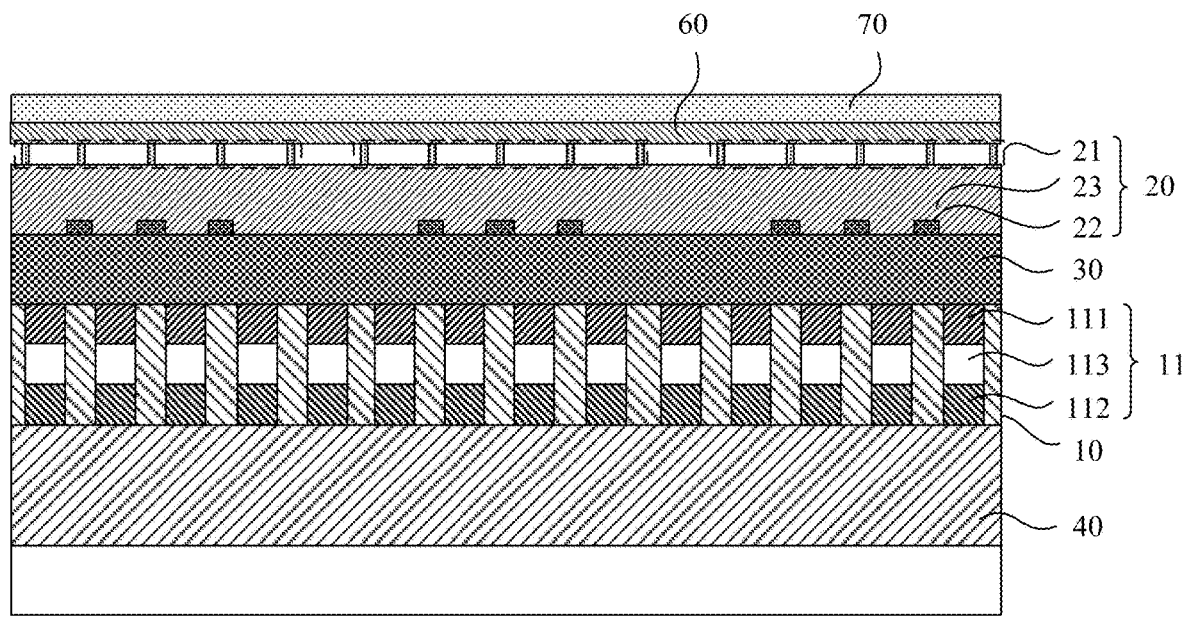
FIG. 5 is a cross-sectional view in a direction LL' in FIG. 4.

FIG. 4 is a schematic diagram of an organic light-emitting touch display panel according to an embodiment of this application. FIG. 5 is a cross-sectional view in a direction LL' in FIG. 4. As shown in FIG. 4 and FIG. 5, the organic light-emitting touch display panel provided in this embodiment of this application includes a display layer 10, a touch layer 20, and a packaging layer 30. The packaging layer 30 is disposed between the display layer 10 and the touch layer 20, and may protect an organic material in the display layer 10 from impact of external water and vapor. In addition, the touch layer 20 is disposed on the packaging layer 30, and the packaging layer 30 provides a flat bearing surface for the touch layer 20. In addition, the touch layer 20 may be directly prepared on the packaging layer 30 by using a same process as that of preparing a functional film layer in the display layer. Therefore, a procedure is simple, no additional device is required, costs are reduced, and reliability is high. Generally, the organic light-emitting touch display panel further includes a switch array layer 40. The switch array layer 40 includes a transistor that controls light emitting of the display layer 10, and the switch array layer 40 is disposed on a side that is of the display layer 10 and that is away from the touch layer 20. In other words, the switch array layer 40, the display layer 10, the packaging layer 30, and the touch layer are disposed in a thickness direction of the organic light-emitting touch display panel.

In addition, as shown in FIG. 5, the organic light-emitting touch display panel provided in this embodiment of this application may further include a polarizer 60 and a cover 70. The polarizer 60 may be attached to the touch layer 20 and disposed on a side of that is the touch layer 20 and that is away from the display layer 10, and the cover 70 is disposed on a side that is of the polarizer 60 and that is away from the display layer 10.

It should be noted that another film layer may be further included between the display layer 10 and the packaging layer 30 and between the packaging layer and the touch layer 20. In addition, the organic light-emitting touch display panel provided in this embodiment of this application may further include another well-known structure such as a substrate, an insulation layer, and a light shield layer.

Specifically, the display layer 10 includes a plurality of display units 11. As shown in FIG. 5, the display unit 11 includes a first electrode 111, a second electrode 112, and an organic light-emitting layer 113, and the organic light-emitting layer 113 is disposed between the first electrode 111 and the second electrode 112. Specifically, the first electrode 111 is disposed on a side that is of the display unit 11 and that is close to the touch layer 20, and the second electrode 112 is disposed on a side that is of the display unit 11 and that is close to the switch array layer 40, and is electrically connected to a transistor. The first electrode 111 and the second electrode 112 excite the organic light-emitting layer 113 to emit light.

Specifically, the touch layer 20 includes a touch-sensitive layer, a first insulation layer 23, and a touch wiring layer that are disposed in the thickness direction of the organic light-emitting touch display panel, and the first insulation layer 23 is disposed between the touch-sensitive layer and the touch wiring layer. In other words, the touch-sensitive layer and the touch wiring layer may be separately located in two non-adjacent film layers that are disposed in the thickness direction of the organic light-emitting touch display panel. The first insulation layer 23 may be prepared by using a process such as sputtering by using SiOx or SiNx, and a thickness of the first insulation layer 23 is relatively thin. In addition, the touch layer 20 is directly disposed on the packaging layer, and without a need of being bonded by using an optical adhesive or the like. Therefore, in the touch manner provided in this embodiment of this application, a thickness of the organic light-emitting touch display panel can be reduced compared with an external mounting solution in the conventional technology. The touch-sensitive layer includes a plurality of mutually insulated touch-sensitive electrodes 21. Each touch-sensitive electrode 21 may receive a touch drive signal and generate a touch-sensitive signal, to implement a form of self-capacitance touch. Because the touch-sensitive electrodes 21 are disposed in a same film layer, a quantity of film layers can be reduced, so that the display panel is thinned.

In addition, the touch wiring layer includes a plurality of touch sensor traces 22. The touch-sensitive electrodes 21 are electrically connected to at least one touch sensor trace 22. The touch sensor trace 22 is used to provide a touch drive signal for the corresponding touch-sensitive electrode 21 and receive a touch-sensitive signal. More specifically, the touch-sensitive electrode 21 is electrically connected to the corresponding touch sensor trace 22 by using a via hole on the first insulation layer 23. Specifically, the touch sensor trace 22 and the touch-sensitive electrode 21 may be prepared by using a process such as exposure, development, or etching. In addition, the touch wiring layer is disposed on a side that is of the first insulation layer 23 and that is close to the packaging layer 20. Further, the touch sensor trace 22 is disposed on the packaging layer 20. Specifically, the touch sensor trace 22 may be directly prepared on the packaging layer 30 by using a process such as deposition, exposure, development, or etching.

In this embodiment of this application, because the touch-sensitive electrodes 21 are disposed in a same layer, and a width of the touch sensor trace 22 is relatively narrow, the touch sensor trace 22 in the touch layer 20 has relatively small impact on a signal on an electrode in the display layer 10, and therefore, impact of the touch layer 20 on a display effect is reduced in this embodiment of this application. In addition, the touch sensor trace 22 and the touch-sensitive electrode 21 are disposed in different layers, so that a distance between adjacent touch electrodes in the touch-sensitive layer is reduced, and touch blind spots are reduced.

Further, the touch-sensitive layer is disposed on a side that is of the first insulation layer 23 and that is away from the packaging layer 20, that is, a side away from the display layer 10. Therefore, a distance between the touch-sensitive electrode 21 and the electrode in the display layer 10 is increased, and particularly, a distance between the touch-sensitive electrode 21 and the first electrode 111 is increased; parasitic capacitance of the touch-sensitive electrode 21 is reduced; and charging and discharging time of the touch-sensitive electrode 21 is shortened.

Table 1 is a performance comparison table between the organic light-emitting touch display panel provided in this embodiment of this application and a mutual-capacitance organic light-emitting touch display panel. Specifically, mutual-capacitance means the mutual-capacitance organic light-emitting touch display panel, and self-capacitance means the organic light-emitting touch display panel provided in this embodiment of this application. It should be noted that a difference between the mutual-capacitance organic light-emitting touch display panel and the organic light-emitting touch display panel provided in this embodiment of this application in the comparison table lies only in a difference of touch layers. Specifically, a touch layer in the mutual-capacitance organic light-emitting touch display panel includes a drive electrode and a sensing electrode that are mutually insulated and intersect each other. In addition, 34 rows and 39 columns of touch units are used in an 8-inch flexible organic light-emitting touch display panel in both mutual-capacitance and self-capacitance in the comparison table. A size of the touch unit is 4 mm×4 mm. The touch unit in self-capacitance is a touch-sensitive electrode, and the touch unit in mutual-capacitance is a region in which a drive electrode and a sensing electrode intersect.

TABLE 1

| Parameter | Mutual-capacitance | | Self-capacitance |
|---|---|---|---|
| | Drive electrode | Sensing electrode | |
| Sensing region resistance/Ω | 475 | 475 | 1 |
| Sensing region capacitance/pF | 375 | 375 | 28 |
| Wire resistance/Ω | 800 | 800 | 5000 |
| Wire capacitance/pF | 8 | 3 | 24 |
| Time constant/μs | 0.49 | 0.49 | 0.26 |

In Table 1, mutual-capacitance sensing region resistance means resistance of a drive electrode or a sensing electrode, and self-capacitance sensing region resistance means resistance of a touch-sensitive electrode; mutual-capacitance sensing region capacitance means capacitance between a drive electrode or a sensing electrode and a first electrode, and self-capacitance sensing region capacitance means capacitance between a touch-sensitive electrode and the first electrode; mutual-capacitance wire resistance means resistance of a touch sensor trace connected to a drive electrode or a sensing electrode, and self-capacitance wire resistance means resistance of a touch sensor trace connected to a touch-sensitive electrode; mutual-capacitance wire capacitance means capacitance of a touch sensor trace, and self-capacitance wire capacitance means capacitance of a touch sensor trace; and a mutual-capacitance time constant means time used to charge a drive electrode to 95% of a target voltage, and a self-capacitance time constant means time used to charge a touch-sensitive electrode to 95% of the target voltage. It may be learned from Table 1 that the time constant of the organic light-emitting touch display panel provided in this embodiment of this application is significantly decreased compared with that of mutual-capacitance, and a reason for the decrease is mainly a decrease in the sensing region capacitance, that is, a decrease in capacitance between the touch-sensitive electrode and the first electrode.

Figure 6:
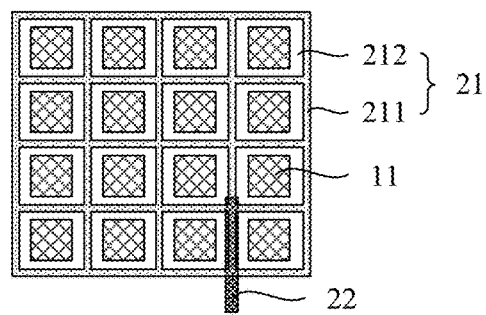
FIG. 6 is a diagram of a partially enlarged organic light-emitting touch display panel according to an embodiment of this application.
Figure 7:
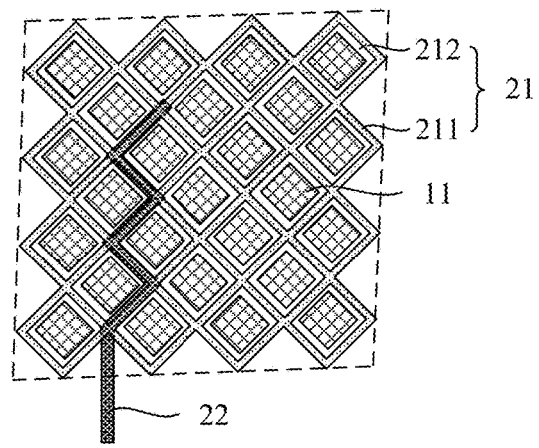
FIG. 7 is a diagram of a partially enlarged organic light-emitting touch display panel according to another embodiment of this application.

In an embodiment of this application, still referring to FIG. 4, the touch-sensitive electrode 21 is in a metal grid structure; in other words, the touch-sensitive electrode 21 is made of one or more metal materials and is a grid structure. FIG. 6 is a diagram of a partially enlarged organic light-emitting touch display panel according to an embodiment of this application. FIG. 7 is a diagram of a partially enlarged organic light-emitting touch display panel according to another embodiment of this application. As shown in FIG. 6 and FIG. 7, the touch-sensitive electrode 21 in the metal grid structure includes a metal part 211 and a hollow part 212 located between metal parts, and a projection of the metal part 211 on the display layer 10 is located between adjacent display units 11. Because the touch-sensitive electrode 21 is made of a metal material, in one aspect, the touch-sensitive electrode 21 has excellent conductive performance and better touch performance, and in another aspect, the touch-sensitive electrode 21 may be designed, while touch performance is ensured, as a grid-shaped structure that includes the hollow part 212, and the hollow part 212 exposes the display unit 11, to prevent excessive film layers from blocking the display unit 11 and improve transmittance.

It should be noted that, to enable the hollow part 212 to expose the display unit 11, and to prevent the metal part 211 from blocking the display unit 11, the metal part 211 needs to be disposed in a manner of arranging the display units 11. As shown in FIG. 6, an extension direction of the metal part 211 of the touch-sensitive electrode 21 may be parallel or perpendicular to a contour of the touch-sensitive electrode 21. Correspondingly, the touch sensor trace 22 may be of a straight-line type. As shown in FIG. 7, an extension direction of the metal part 211 of the touch-sensitive electrode 21 may alternatively form a non-vertical and non-parallel angle with the contour (as shown by dashed lines) of the touch-sensitive electrode 21. Correspondingly, the touch sensor trace 22 may be of a fold-line type. Optionally, a projection of the touch sensor trace 22 on the touch-sensitive layer overlaps some metal parts 211.

Referring to FIG. 6 and FIG. 7, in an embodiment of this application, the contour of the touch-sensitive electrode 21 may be a rectangle, and the contour herein means a connection line of points at an outermost part of the touch-sensitive electrode 21. As shown in FIG. 7, an edge of each display unit 11 is neither parallel to a row direction nor parallel to a column direction. Therefore, at least some metal parts 211 of the touch-sensitive electrode 21 are neither parallel to the row direction nor parallel to the column direction, and metal parts 211 on a periphery that are neither parallel to the row direction nor parallel to the column direction constitute a specific sawtooth structure. A connection line of vertexes closest to the periphery in the sawtooth structure is the contour described in this embodiment of this application.

Figure 8:
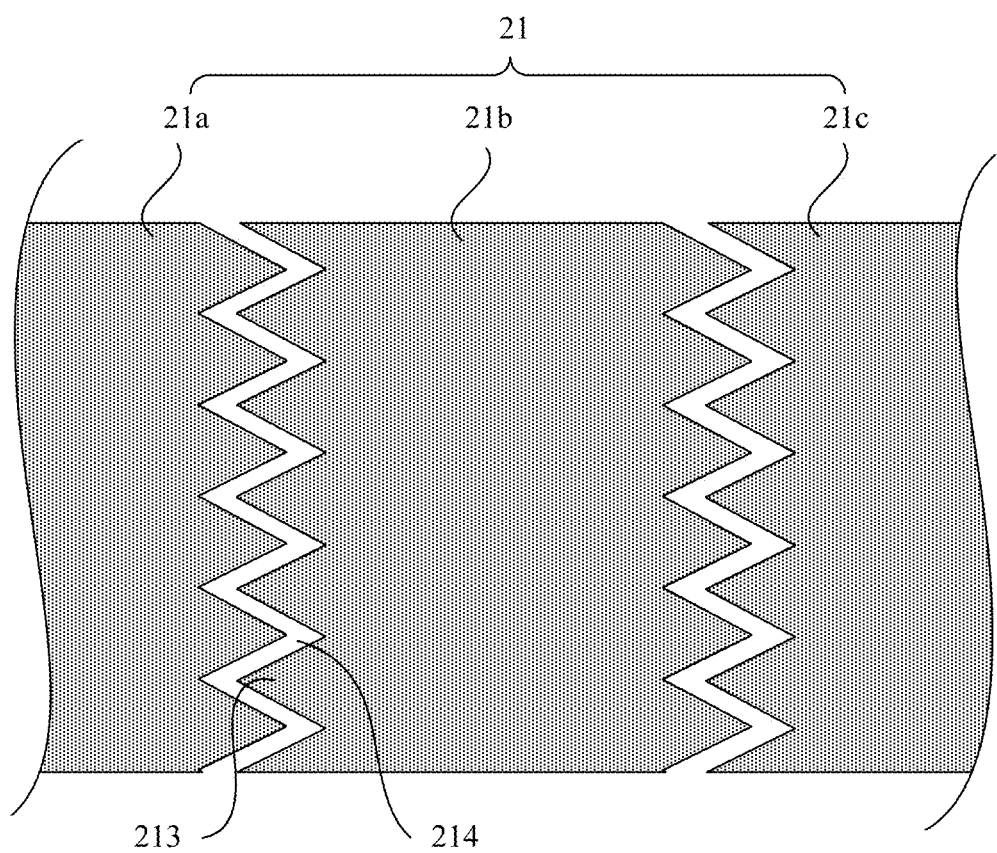
FIG. 8 is a schematic diagram of a touch-sensitive electrode according to an embodiment of this application.
Figure 9:
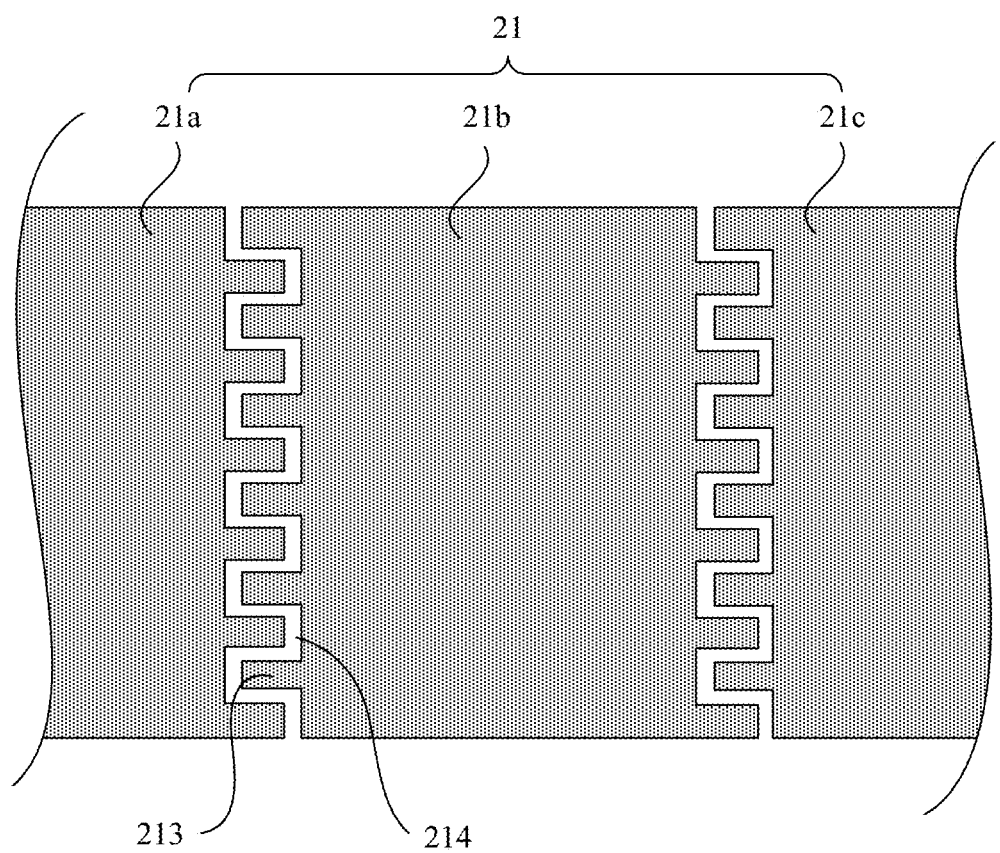
FIG. 9 is a schematic diagram of a touch-sensitive electrode according to another embodiment of this application.
Figure 10:
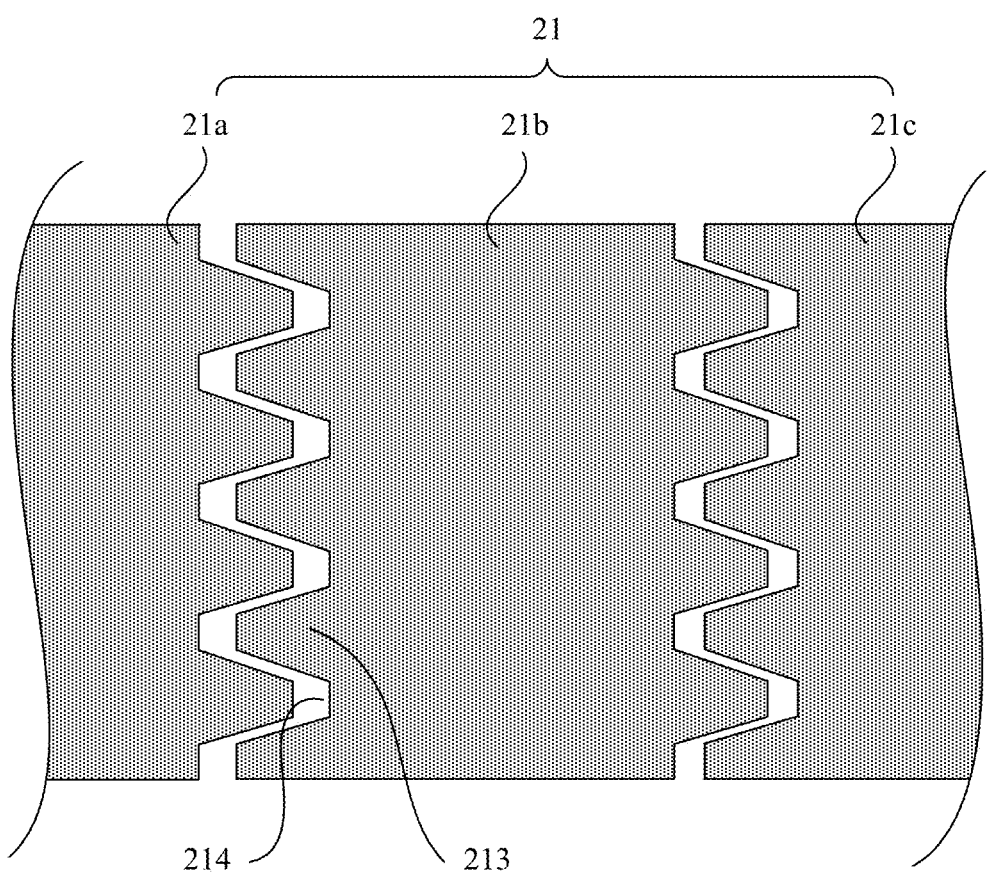
FIG. 10 is a schematic diagram of a touch-sensitive electrode according to still another embodiment of this application.

FIG. 8 is a schematic diagram of a touch-sensitive electrode according to an embodiment of this application. FIG. 9 is a schematic diagram of a touch-sensitive electrode according to another embodiment of this application. FIG. 10 is a schematic diagram of a touch-sensitive electrode according to still another embodiment of this application. It should be noted that FIG. 8 to FIG. 10 merely show a shape of the touch-sensitive electrode 21 according to an embodiment of this application. As described in the foregoing embodiment, the touch-sensitive electrode 21 may be a grid structure. To clearly indicate a technical point to be protected in this embodiment, the grid structure is not shown herein, but the foregoing embodiment may be combined with this embodiment. As shown in FIG. 8 to FIG. 10, some edges of the touch-sensitive electrode 21 include a convex part 213 and a concave part 214, and in two adjacent touch-sensitive electrodes 21, a convex part 213 of one touch-sensitive electrode 21 is disposed in a concave part 214 of the other touch-sensitive electrode 21. Specifically, as shown in FIG. 9 and FIG. 10, in a touch-sensitive electrode 21a, a touch-sensitive electrode 21b, and a touch-sensitive electrode 21c that are sequentially disposed adjacent to each other, a right-edge convex part 213 of the touch-sensitive electrode 21a is disposed in a left-edge concave part 214 of the touch-sensitive electrode 21b, a left-edge convex part 213 of the touch-sensitive electrode 21b is disposed in a right-edge concave part 214 of the touch-sensitive electrode 21a, a right-edge convex part 213 of the touch-sensitive electrode 21b is disposed in a left-edge concave part 214 of the touch-sensitive electrode 21c, and a left-edge convex part 213 of the touch-sensitive electrode 21c is disposed in a right-edge concave part 214 of the touch-sensitive electrode 21b.

After touching occurs, capacitance corresponding to a plurality of touch-sensitive electrodes 21 around a touch position changes. Generally, electrical signals of the plurality of touch-sensitive electrodes 21 are weighted to determine the touch position; in other words, the touch position is determined by using a center of gravity algorithm. When the touch position changes by a relatively small distance, for example, a finger used for touching moves slightly, the plurality of touch-sensitive electrodes 21 at an initial touch position and a plurality of touch-sensitive electrodes 21 at a moved touch position may basically remain unchanged or respective electrical signals basically remain unchanged. Determining may be inaccurate when the touch position is re-determined by using the center of gravity algorithm. In a structure of the touch-sensitive electrode 21 shown in FIG. 8 to FIG. 10, when the touch position moves slightly by using one touch-sensitive electrode 21 as an initial point, an electrical signal of a surrounding touch-sensitive electrode can be rapidly changed, and the electrical signal is significantly changed. Therefore, this helps determine a slightly moved position by using the center of gravity algorithm, and improve detection accuracy of a touching action.

As shown in FIG. 8, a shape of the convex part 213 may be a triangle. As shown in FIG. 9, the shape of the convex part 213 may be a rectangle. As shown in FIG. 10, the shape of the convex part 213 may alternatively be a trapezoid.

It should be noted that FIG. 8 to FIG. 10 show that left and right edges of the touch-sensitive electrode 21 include the convex part 213 and the concave part 214. In another implementation, upper and lower edges of the touch-sensitive electrode 21 include the convex part 213 and the concave part 214, and the convex part 213 is disposed in an adjacent concave part 214. In another implementation, upper, lower, left, and right edges of the touch-sensitive electrode 21 may all include the convex part 213 and the concave part 214.

It should be further noted that, in this embodiment, the convex part 213 and the concave part 214 that are included on the edge of the touch-sensitive electrode 21 are different from the sawtooth structure in the foregoing embodiment. In the sawtooth structure in the foregoing embodiment, the edge of the touch-sensitive electrode 21 is not a smooth straight line because of an arrangement manner of the display units 11. Therefore, a size of the sawtooth structure is usually a size of a pixel region corresponding to one display unit 11. A length of the convex part 213 and/or a length of the concave part 214 included on the edge of the touch-sensitive electrode 21 in this embodiment of this application are/is approximately one third of a width of the touch-sensitive electrode 21, and in addition, the convex part 213 is disposed in the adjacent concave part 214. Therefore, detection accuracy of the touching action is improved if the slightly moved position is determined by using the center of gravity algorithm.

Referring to FIG. 4, the organic light-emitting touch display panel includes a bonded region AA, and the bonded region AA includes a plurality of bonding pads 50. The bonding pad 50 is bonded (bonding) to an integrated circuit chip. Alternatively, the bonding pad 50 is bonded to a flexible circuit board, and an integrated circuit chip is bonded on the flexible circuit board. The integrated circuit chip provides a touch drive voltage for the touch-sensitive electrode 21. Specifically, the integrated circuit chip is electrically connected to the bonding pad 50 in the bonding region AA of the organic light-emitting touch display panel, to provide a touch drive voltage for the touch-sensitive electrode 21.

The plurality of touch-sensitive electrodes 21 include a first touch-sensitive electrode and a second touch-sensitive electrode, and a distance between the first touch-sensitive electrode and the bonding region AA is greater than a distance between the second touch-sensitive electrode and the bonding region AA. It may be understood that, in any two touch-sensitive electrodes 21 that are located in different rows, a touch-sensitive electrode 21 that is closer to the bonding region AA may be used as the second touch-sensitive electrode in this embodiment of this application, and a touch-sensitive electrode that is farther from the bonding region AA may be used as the first touch-sensitive electrode in this embodiment of this application. It may also be understood that the plurality of touch-sensitive electrodes 21 are classified into at least two types. One type of touch-sensitive electrode 21 is relatively close to the bonding region AA, and is referred to as the second touch-sensitive electrode. Another type of touch-sensitive electrode 21 is relatively far away from the bonding region AA, and is referred to as the first touch-sensitive electrode.

It may be seen from FIG. 4 that a larger distance between the touch-sensitive electrode 21 and the bonding region AA corresponds to a longer length of an electrically connected touch sensor trace 22, that is, larger resistance. When the touch sensor trace 22 transmits a touch drive voltage to the touch-sensitive electrode 21, a touch sensor trace 22 with larger resistance has a larger divided voltage, and consequently, the touch drive voltage of the corresponding touch-sensitive electrode 21 is small, touch precision is affected, and a resistance difference caused by a difference in lengths of touch sensor traces 22 also affects touch uniformity. In an embodiment of this application, a quantity of touch sensor traces 22 electrically connected to the first touch-sensitive electrode is greater than a quantity of touch sensor traces 22 electrically connected to the second touch-sensitive electrode. A quantity of touch sensor traces 22 electrically connected to a touch-sensitive electrode 21 that is relatively far away from the bonding region AA is increased, and this is equivalent to that the touch sensor traces 22 are connected in parallel, so that resistance is reduced, and a touch drive voltage received by the touch-sensitive electrode 21 that is relatively far away from the bonding region AA is prevented from excessive attenuation.

Figure 11:
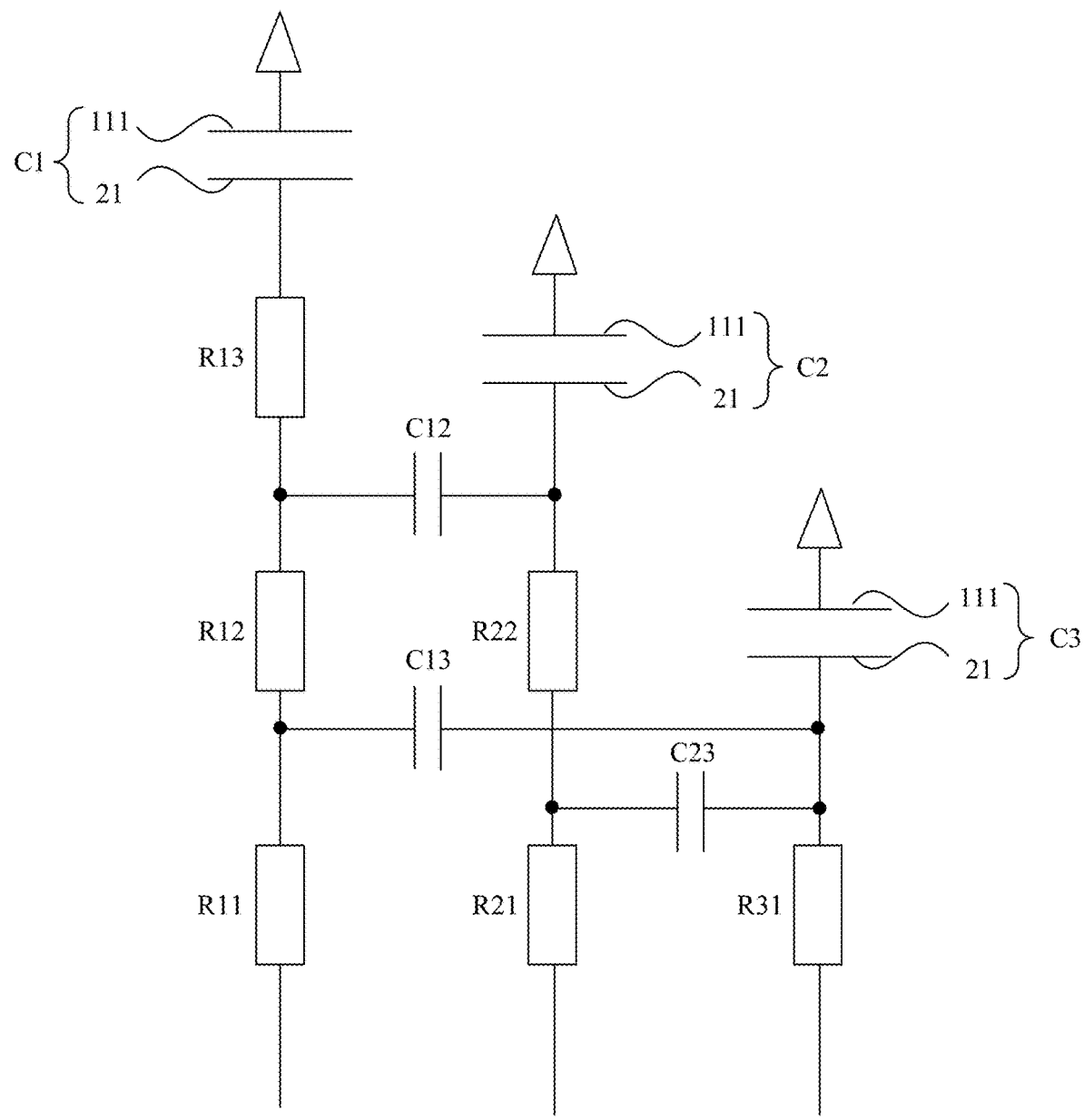
FIG. 11 is a diagram of a partial equivalent circuit of a display panel according to an embodiment of this application.

In an embodiment of this application, in one touch period, a time at which the second touch-sensitive electrode receives the touch drive voltage is earlier than a time at which the first touch-sensitive electrode receives the touch drive voltage. Preferably, in one drive period, a sequence of receiving the touch drive voltage by the touch-sensitive electrodes 21 is: from bottom to top row by row from a row of touch-sensitive electrodes 21 that are the closest to the bonding region AA. FIG. 11 is a diagram of a partial equivalent circuit of a display panel according to an embodiment of this application. Refer to FIG. 4 and FIG. 11. FIG. 11 is a partial equivalent circuit diagram of corresponding positions of one column of touch-sensitive electrodes 21 in FIG. 4. Descriptions are provided below with reference to FIG. 4 and FIG. 11. A resistor R11, a resistor R12, and a resistor R13 that are connected in series in FIG. 11 are equivalent to an equivalent circuit of a touch sensor trace 22 connected to a touch-sensitive electrode 21 that is the farthest from the bonding region AA in FIG. 4, and this is equivalent to that the touch sensor trace passes through positions of all touch-sensitive electrodes in one row and overlaps the positions. Therefore, the resistor R11, the resistor R12, and the resistor R13 are classified based on a position of the touch-sensitive electrode 21. In this case, a capacitor C1 is a capacitor between the touch-sensitive electrode 21 that is the farthest from the bonding region AA and a first electrode 111 at a position of the touch-sensitive electrode 21. FIG. 4 schematically shows only three rows of touch-sensitive electrodes 21. A capacitor C12 is a capacitor between a touch sensor trace 22 connected to the touch-sensitive electrode 21 that is the farthest from the bonding region AA and a second touch-sensitive electrode 21 at a position of the second touch-sensitive electrode 21, and a capacitor C13 is a capacitor between the touch sensor trace 22 connected to the touch-sensitive electrode 21 that is the farthest from the bonding region AA and a third touch-sensitive electrode 21 at the position of the second touch-sensitive electrode 21. Correspondingly, a resistor R21 and a resistor R22 that are connected in series are equivalent to equivalent resistors of a touch sensor trace 22 connected to a touch-sensitive electrode 21 at a moderate distance from the bonding region AA in FIG. 4 at a position of a touch-sensitive electrode 21 through which the touch sensor trace 22 passes; a capacitor C2 is a capacitor between the touch-sensitive electrode 21 at a moderate distance from the bonding region AA and a first electrode 111 at a position of the touch-sensitive electrode 21; and C23 is a capacitor between the touch sensor trace 22 connected to the touch-sensitive electrode 21 at a moderate distance from the bonding region AA and a third touch-sensitive electrode 21 at a position of the third touch-sensitive electrode 21. Correspondingly, a resistor R31 is equivalent to an equivalent resistor of a touch sensor trace 22 connected to a touch-sensitive electrode 21 that is the closest to the bonding region AA in FIG. 4, and a capacitor C3 is a capacitor between the touch-sensitive electrode 21 that is the closest to the bonding region AA and a first electrode 111 at a position of the touch-sensitive electrode 21.

It can be learned that when a touch sensor trace 22 connected to any touch-sensitive electrode 21 passes through another touch-sensitive electrode 21 that is insulated from the touch sensor trace 22, a capacitor is formed when there is an electrical signal between the touch sensor trace 22 and the touch-sensitive electrode 21 that is insulated from the touch sensor trace 22, and the touch sensor trace 22 that is electrically connected to the touch-sensitive electrode 21 may be considered as a plurality of resistors that are connected in series.

When the touch drive voltage is first output to a touch-sensitive electrode 21 close to the bonding region AA, because a capacitor is formed between the touch-sensitive electrode 21 and a touch sensor trace that passes through a position of the touch-sensitive electrode 21 and that is insulated from the touch-sensitive electrode 21, the touch sensor trace 22 generates an electrical signal. For example, when a rightmost touch-sensitive electrode 21 in FIG. 11 receives the touch drive voltage, both two touch sensor traces on a left side of the touch-sensitive electrode 21 generates an electrical signal due to existence of capacitors R23 and R13, and this is equivalent to pre-charging. Therefore, when the touch drive voltage is output to the touch-sensitive electrode 21 corresponding to the two touch sensor traces on the left side, a charging speed can be improved. Because a longer length of the touch sensor trace 22 leads to a larger divided-voltage of a resistor of the touch sensor trace 22 and a slower charging speed, sufficient pre-charging may be performed before charging is performed. Therefore, time used by the touch-sensitive electrode 21 to receive the touch drive voltage is determined based on a length of the touch sensor trace 22, that is, a distance between the touch-sensitive electrode 21 and the bonding region AA, so that the charging speed can be significantly improved.

In addition, a distance between the touch-sensitive layer and the touch wiring layer is approximately 0.3 μm. Therefore, a capacitance value of a capacitor such as the capacitor C12, the capacitor C13, and the capacitor C23 between the touch sensor trace 22 and a touch-sensitive electrode that is insulated from and stacked together with the touch sensor trace 22 may be of a magnitude of 10 pF, so that a pre-charging effect can be improved.

Figure 12:
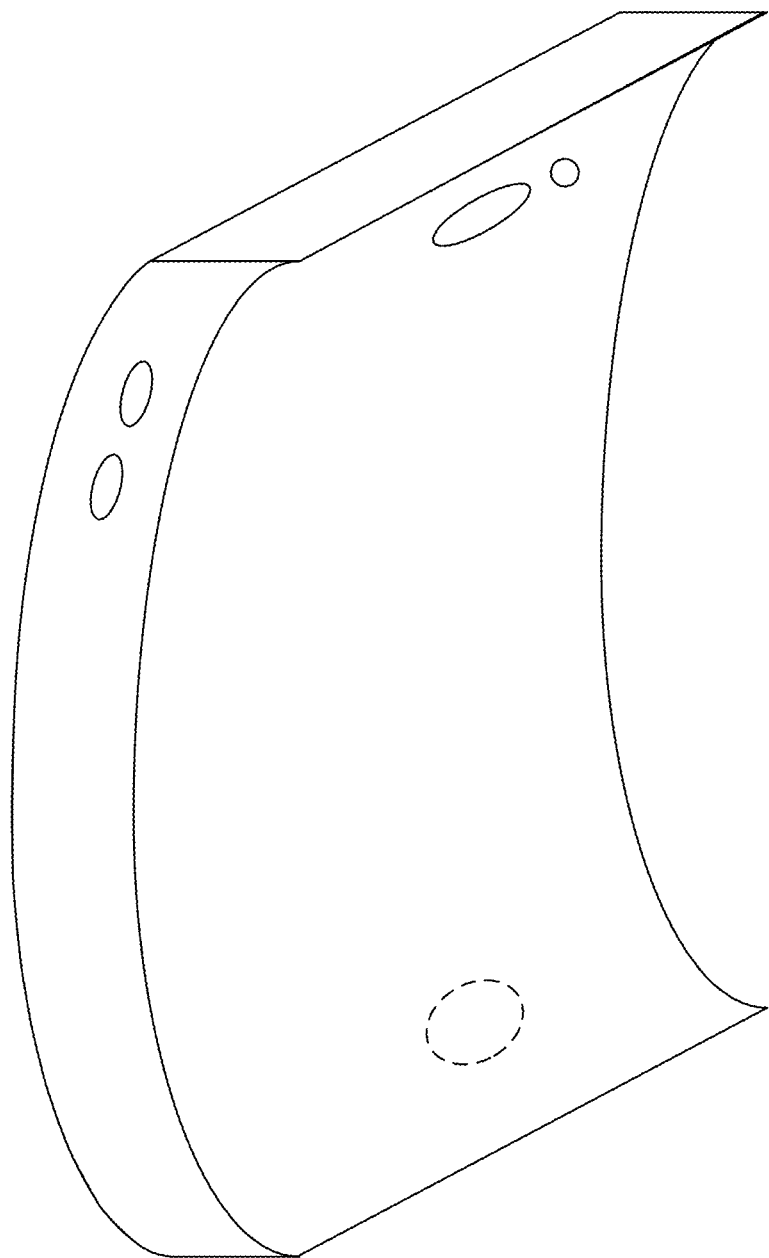
FIG. 12 is a schematic diagram of an organic light-emitting touch display apparatus according to an embodiment of this application.

This application further provides an organic light-emitting touch display apparatus, including the organic light-emitting touch display panel provided in any one of the foregoing embodiments. The organic light-emitting touch display apparatus provided in this embodiment of this application may be any one of a mobile phone, a tablet computer, a television set, or the like. FIG. 12 is a schematic diagram of an organic light-emitting touch display apparatus according to an embodiment of this application. As shown in FIG. 12, the organic light-emitting touch display apparatus provided in this embodiment of this application may be a flexible display apparatus.

In the organic light-emitting touch display apparatus provided in this embodiment of this application, touch-sensitive electrodes are disposed in a same film layer, so that a quantity of film layers can be reduced, and the display panel is thinned. In addition, the touch-sensitive electrode and a touch sensor trace are located in different film layers, so that a distance between adjacent touch electrodes in a touch-sensitive layer is reduced, and touch blind spots are reduced.

The foregoing descriptions are merely specific implementations of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An organic light-emitting touch display panel, comprising:
   a display layer comprising a plurality of display units, wherein a display unit of the plurality of display units comprises a first electrode, a second electrode, and an organic light-emitting layer, and the organic light-emitting layer is disposed between the first electrode and the second electrode;
   a touch layer comprising a touch-sensitive layer, a first insulation layer, and a touch wiring layer, wherein the touch-sensitive layer, the first insulation layer, and the touch wiring layer are disposed in a thickness direction of the organic light-emitting touch display panel, the first insulation layer is disposed between the touch-sensitive layer and the touch wiring layer, wherein the touch-sensitive layer comprises a plurality of touch-sensitive electrodes that are insulated from each other, the touch wiring layer comprises a plurality of touch sensor traces, and the plurality of touch-sensitive electrodes are electrically connected to at least one touch sensor trace; and
   a packaging layer disposed between the display layer and the touch layer, wherein the touch layer is disposed on the packaging layer, wherein
   the touch layer and the display layer are disposed in the thickness direction of the organic light-emitting touch display panel;
   wherein the organic light-emitting touch display panel comprises a bonding region, and the bonding region comprises a plurality of bonding pads; wherein the plurality of bonding pads are bonded to an first integrated circuit chip, or to a flexible circuit board bonded with a second integrated circuit chip, wherein the first or the second integrated circuit chip provides a touch drive voltage for the plurality of touch-sensitive electrodes;
   wherein the plurality of touch-sensitive electrodes comprise a first touch-sensitive electrode and a second touch-sensitive electrode, and a first distance between the first touch-sensitive electrode and the bonding region is greater than a second distance between the second touch-sensitive electrode and the bonding region; and
   wherein in one touch period, a time at which the second touch-sensitive electrode receives the touch drive voltage is earlier than a time at which the first touch-sensitive electrode receives the touch drive voltage.

2. The organic light-emitting touch display panel according to claim 1, wherein the touch wiring layer is disposed on a side that is of the first insulation layer and that is close to the packaging layer.

3. An organic light-emitting touch display apparatus, comprising the organic light-emitting touch display panel according to claim 2.

4. The organic light-emitting touch display panel according to claim 1, wherein each of the plurality of touch sensitive electrodes is in a metal grid structure.

5. The organic light-emitting touch display panel according to claim 4, wherein each of the plurality of touch sensitive electrodes comprises a metal part and a hollow part located between metal parts, and a projection of the metal part on the display layer is located between the plurality of display units.

6. An organic light-emitting touch display apparatus, comprising the organic light-emitting touch display panel according to claim 5.

7. The organic light-emitting touch display panel according to claim 4, wherein a contour of each of the plurality of touch sensitive electrodes is a rectangle.

8. An organic light-emitting touch display apparatus, comprising the organic light-emitting touch display panel according to claim 7.

9. The organic light-emitting touch display panel according to claim 4, wherein some edges of each of the plurality of touch sensitive electrodes comprise a convex part and a concave part; and in two adjacent touch-sensitive electrodes, a convex part of one touch-sensitive electrode is disposed in a concave part of the other touch-sensitive electrode.

10. An organic light-emitting touch display apparatus, comprising the organic light-emitting touch display panel according to claim 9.

11. The organic light-emitting touch display panel according to claim 4, wherein a shape of a convex part is at least one of a rectangle, a triangle, and a trapezoid.

12. An organic light-emitting touch display apparatus, comprising the organic light-emitting touch display panel according to claim 11.

13. An organic light-emitting touch display apparatus, comprising the organic light-emitting touch display panel according to claim 4.

14. The organic light-emitting touch display panel according to claim 1, wherein a quantity of touch sensor traces electrically connected to the first touch-sensitive electrode is greater than a quantity of touch sensor traces electrically connected to the second touch-sensitive electrode.

15. An organic light-emitting touch display apparatus, comprising the organic light-emitting touch display panel according to claim 14.

16. An organic light-emitting touch display apparatus, comprising the organic light-emitting touch display panel according to claim 1.

* * * * *